United States Patent [19]

Murata et al.

[11] Patent Number: 4,931,719
[45] Date of Patent: Jun. 5, 1990

[54] HALL-EFFECT SENSOR ARRANGEMENT

[75] Inventors: Shigemi Murata; Yutaka Ohashi, both of Himeji, Japan

[73] Assignee: Mitsubishi Denki Kabushiki Kaisha, Tokyo, Japan

[21] Appl. No.: 389,468

[22] Filed: Aug. 4, 1989

[30] Foreign Application Priority Data

Aug. 5, 1988 [JP] Japan .............................. 63-103201[U]

[51] Int. Cl.$^5$ .......................... H03H 5/00; F02P 3/00
[52] U.S. Cl. .................................... 323/368; 323/294; 123/146.5 A; 123/617; 123/647
[58] Field of Search ............... 323/364, 368, 293, 294; 123/146.5 A, 617, 647

[56] References Cited

U.S. PATENT DOCUMENTS

| | | | |
|---|---|---|---|
| 3,265,959 | 8/1966 | Wiehl et al. | 323/368 |
| 3,396,328 | 8/1968 | Yuan | 323/368 |
| 4,124,936 | 11/1978 | Jellissen | 123/146.5 A |
| 4,235,213 | 11/1980 | Jellissen | 123/146.5 A |
| 4,359,978 | 11/1982 | Brammer et al. | |
| 4,398,342 | 8/1983 | Pitt et al. | 323/368 |
| 4,462,347 | 7/1984 | Brammer et al. | 123/146.5 A |
| 4,634,961 | 1/1987 | Popovic et al. | 323/368 |

Primary Examiner—Peter S. Wong
Attorney, Agent, or Firm—Sughrue, Mion, Zinn, Macpeak & Seas

[57] ABSTRACT

A Hall-effect magnetic sensor arrangement comprises a sensor element utilizing the Hall-effect and disposed in a magnetic circuit including a magnetic pole unit in an opposing relationship with respect to the magnetic pole unit with a predetermined distance therebetween, a sensor frame surrounding the sensor element and having a cave defined at the opposite side of the magnetic pole unit with respect to the sensor element and at a side perpendicular to a magnetic path and a soft filler material filled in the cave for protecting the sensor element. The sensor arrangement comprises a nonmagnetic thin plate member disposed at the side of the sensor element opposite to the magnetic pole unit and supported at its outer edge by the sensor frame for preventing the filler material to flow out from the cave.

2 Claims, 1 Drawing Sheet

HALL-EFFECT SENSOR ARRANGEMENT

BACKGROUND OF THE INVENTION

This invention relates to a Hall-effect sensor arrangement and more particularly to a Hall-effect sensor particularly suitable for use in a rotational position detector for an internal combustion engine.

FIG. 1 is a schematic sectional side view of the main portion of a conventional Hall-effect magnetic sensor arrangement used in a rotational angular position detector for an internal combustion engine. It is seen that the Hall-effect magnetic sensor element 1 is held by a molded sensor frame 2. In a gap 2a defined between the sensor frame 2 and the sensor element 1, a soft filler material 3 such as a gell material of silicone gell for example is filled in order to protect the sensor element 1 from any mechanical force acting on the sensor element 1 and against any corrosive gas. While the sensor element 1 contains therein a neccessary circuit and the like for a proper sensor function in the form of a hybrid IC circuit, the detailed explanation thereof is omitted because the sensor element 1 may be any suitable well-known commercially available element. It is also seen that a magnet is mounted on a magnetic central axis A of the sensor element 1 with a magnetic gap B between the magnet 4 and the sensor element 1 in order to generate a magnetic field needed by the sensor element 1.

With the above sensor arrangement of the conventional design, an unillustrated magnetic flux shutter attached to a moving member may be used so that it moves in the direction perpendicular to the plane of the figure through the gap B between the magnet 4 and the sensor element 1, whereby the rotational position, the rotational angle, displacement, etc. can be detected through the measured change in the magnitude of the magnetic flux passing through the Hall-effect sensor element 1. The Hall-effect magnetic sensor as described above may be advantageously used in an internal combustion engine distributor as a rotational angle detector for a crank shaft of an internal combustion engine.

In the conventional Hall-effect magnetic sensor arrangement as described above, the magnet 4 is supported and covered at its side face 1a facing toward the pole face 4a of the magnet 4 by a molded resin material wall 2b of the sensor frame 2 which has a relatively large thickness t. This wall thickness t must be relatively large because of the neccessary mechanical strength of the wall 2b, so that the distance L1 between the magnetic pole face 4a of the magnet 4 and the side face 1a of the sensor element 1 must inevitably be large, resulting in a poor signal accuracy.

SUMMARY OF THE INVENTION

Accordingly, one object of the present invention is to provide a Hall-effect magnetic sensor arrangement free from the above-discussed problem of the conventional magnetic sensor arrangement.

Another object of the present invention is to provide a Hall-effect magnetic sensor arrangement high in signal accuracy.

Another object of the present invention is to provide a Hall-effect magnetic sensor arrangement accurate and compact in size.

With the above objects in view, the Hall-effect magnetic sensor arrangement of the present invention comprises a sensor element utilizing the Hall-effect and disposed in a magnetic circuit including a magnetic pole unit in an opposing relationship with respect to the magnetic pole unit with a predetermined distance therebetween, a sensor frame surrounding the sensor element and having a cave defined at the opposite side of the magnetic pole unit with respect to the sensor element and at a side perpendicular to a magnetic path and a soft filler material filled in the cave for protecting the sensor element. According to the present invention, the sensor arrangement comprises a nonmagnetic thin plate member disposed at the side of the sensor element opposite to the magnetic pole unit and supported at its outer edge by the sensor frame for preventing the filler material to flow out from the cave, whereby the distance between the magnet and the sensor element is decreased.

BRIEF DESCRIPTION OF THE DRAWINGS

The present invention will become more readily apparent from the following detailed description of the preferred embodiment of the present invention tanken in conjunction with the accompanying drawings, in which.

DESCRIPTION OF THE PREFERRED EMBODIMENT

Figure 1:
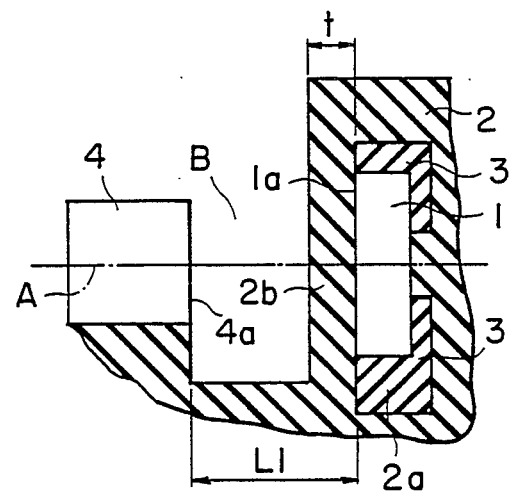
FIG. 1 is a schematic sectional side view of the main portion of a conventional Hall-effect magnetic sensor arrangement particularly useful in a rotational angular position detector for an internal combustion engine.
Figure 2:
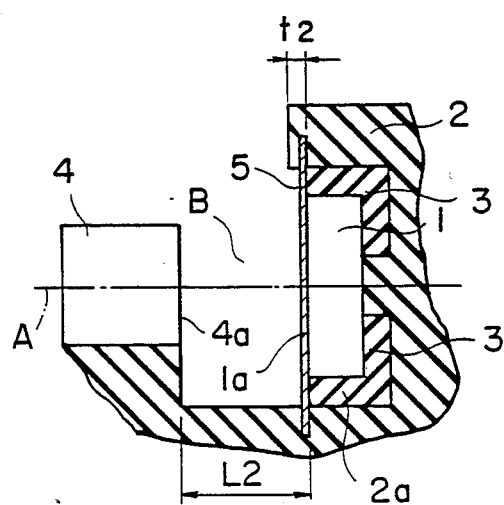
FIG. 2 is a schematic sectional side view of the main portion of the Hall-effect magnetic sensor arrangement of the present invention particularly useful in a rotational angular position detector in an internal combustion engine.

In FIG. 2, the reference numeral 5 designates a nonmagnetic thin plate member which may be made of a stainless steel sheet for example. The plate member 5 is supported by the sensor frame 2 at its circumferential edge embedded in the sensor frame 2 to seal the sensor element 1 and to prevent a soft filler material 3 such as a gell material of silicone gell material. Other reference numerals and characters designate identical or corresponding components described and shown in connection with the conventional sensor arrangement shown in FIG. 1.

According to this arrangement, since the nonmagnetic thin plate member 5 is used to support the sensor element 1 and to cover the cavity 3 filled with the soft filler material 2a, the dimension t2 which corresponds to the wall thickness t of the wall 2b of the sensor frame 2 is much smaller than the wall thickness t of the conventional design. Therefore, the distance L2 between the magnetic pole face 4a of the magnet 4 and the sensor side face 1a can be made much smaller than the distance L1 between the magnet 4 and the sensor 1 of the conventional device shown in FIG. 1. This enables the signal accuracy to be much improved and the sensor arrangement can be made small-sized.

While only one embodiment of the present invention has been described and illustrated, various modification can be achieved without departing from the spirit of the present invention. For example, the material of the thin nonmagnetic plate member 5 is not limited to stainless steel. The plate member 5 may be made of another nonmagnetic metal or plastic material. Also, the soft filler material 3 is not limitted to silicone gel material. Further, the cavity 2a in which the filler material 3 is to be filled is sufficient if it is provided at at least one portion of the side of the sensor element 1 opposite to the magnetic pole face 4a and perpendicular to the magnetic path.

Further, the Hall-effect magnetic sensor arrangement of the present invention is not limited to be used in an internal combustion engine rotational position detector, but it can be advantageously used in position and angle detection in various fields.

As has been described, the Hall-effect magnetic sensor arrangement of the present invention comprises a sensor element utilizing the Hall-effect and disposed in a magnetic circuit including a magnetic pole unit in an opposing relationship with respect to the magnetic pole unit with a predetermined distance therebetween, a sensor frame surrounding the sensor element and having a cave defined at the opposite side of the magnetic pole unit with respect to the sensor element and at a side perpendicular to a magnetic path and a soft filler material filled in the cave for protecting the sensor element. Since the sensor arrangement comprises a nonmagnetic thin plate member disposed at the side of the sensor element opposite to the magnetic pole unit and supported at its outer edge by the sensor frame for preventing the filler material to flow out from the cave, the distance between the magnet and the sensor element can be decreased, resulting in a Hall-effect magnetic sensor arrangement high in signal accuracy and compact in size.

What is claimed is:

1. A Hall-effect magnetic sensor arrangement comprising:
    a magnetic sensor element utilizing the Hall-effect and disposed in a magnetic circuit including a magnetic pole unit in an opposing relationship with respect to said magnetic pole unit with a predetermined distance therebetween;
    a sensor frame surrounding said sensor element and having a cave defined at the opposite side of said magnetic pole unit with respect to said sensor element and at a side perpendicular to a magnetic path;
    a soft filler material filled in said cave for protecting said sensor element;
    a nonmagnetic thin plate member disposed at the side of said sensor element opposite to said magnetic pole unit and supported at its outer edge by said sensor frame for preventing said filler material to flow out from said cave.

2. A Hall-effect magnetic sensor arrangement as claimed in claim 1, wherein said nonmagnetic thin plate member comprises a stainless steel sheet.

* * * * *